United States Patent
Tang

(10) Patent No.: US 10,361,402 B2
(45) Date of Patent: Jul. 23, 2019

(54) POROUS SUBSTRATE AND FABRICATING METHOD THEREOF, AND A FABRICATING METHOD FOR THIN FILM TRANSISTOR

(71) Applicant: Wuhan China Star Optoelectronics Technology Co., Ltd., Wuhan, Hubei (CN)

(72) Inventor: Fan Tang, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 179 days.

(21) Appl. No.: 15/328,416

(22) PCT Filed: Dec. 23, 2016

(86) PCT No.: PCT/CN2016/111801
§ 371 (c)(1),
(2) Date: Jan. 23, 2017

(87) PCT Pub. No.: WO2018/112919
PCT Pub. Date: Jun. 28, 2018

(65) Prior Publication Data
US 2018/0294442 A1    Oct. 11, 2018

(30) Foreign Application Priority Data
Dec. 12, 2016 (CN) .......................... 2016 1 1195243

(51) Int. Cl.
*H01L 21/00* (2006.01)
*H01L 51/56* (2006.01)
(Continued)

(52) U.S. Cl.
CPC .............. *H01L 51/56* (2013.01); *H01L 21/77* (2013.01); *H01L 27/3262* (2013.01);
(Continued)

(58) Field of Classification Search
CPC ......... H01L 51/56; H01L 21/77; H01L 27/02; H01L 27/3262; H01L 29/66742
See application file for complete search history.

(56) References Cited

U.S. PATENT DOCUMENTS 6,492,195 B2    12/2002 Nakanishi

FOREIGN PATENT DOCUMENTS

CN    102956668 A    3/2013
CN    103682176 A    3/2014
(Continued)

*Primary Examiner* — Richard A Booth
(74) *Attorney, Agent, or Firm* — Andrew C. Cheng

(57) ABSTRACT

The present application discloses a fabricating method for a thin film transistor, including steps of: S1, filling filling materials into the pores of the porous substrate to obtain a carrier substrate; S2, fabricating a flexible film layer on the carrier substrate; S3, removing the filler material; S4, fabricating an organic light emitting diode on the flexible film layer; and S5, removing the porous substrate to obtain the thin film transistor. The fabricating method of the thin film transistor according to the present application is based on a porous substrate having a microporous structure, due to the presence of microporous, the bubbles generated during the OLED fabricating process can be released to avoid the damage of the bubbles during the laser irradiation and to the deposition metal mask; and eliminating the process of removing the sacrificial layer by laser irradiation, and the heating the heating process in the conventional technology.

4 Claims, 3 Drawing Sheets

(51) Int. Cl.
*H01L 51/00* (2006.01)
*H01L 27/32* (2006.01)
*H01L 21/77* (2017.01)
*H01L 29/66* (2006.01)
*H01L 27/12* (2006.01)

(52) U.S. Cl.
CPC ...... *H01L 29/66742* (2013.01); *H01L 51/003* (2013.01); *H01L 27/1218* (2013.01); *H01L 27/1266* (2013.01); *H01L 2227/323* (2013.01); *H01L 2227/326* (2013.01); *H01L 2251/5338* (2013.01)

(56) References Cited

FOREIGN PATENT DOCUMENTS

| | | |
|---|---|---|
| CN | 104319263 A | 1/2015 |
| CN | 105428312 A | 3/2016 |

POROUS SUBSTRATE AND FABRICATING METHOD THEREOF, AND A FABRICATING METHOD FOR THIN FILM TRANSISTOR

FIELD OF THE INVENTION

The present application relates to a semiconductor technology field, and more particularly to a porous substrate and fabricating method thereof, and a fabricating method for thin film transistor.

BACKGROUND OF THE INVENTION

At present, the fabricating method of the flexible OLED devices are usually used glass substrate as a supporter and for med by the following major steps: (1) coating a layer of special rubber material on the surface of the glass substrate, or depositing a layer of inorganic material as a sacrificial layer; (2) coating monomer, polymer or the mixed solution of the monomer and the prepolymer on the sacrificial layer, and polymerized the monomer into a flexible film by a process such as baking; (3) depositing a water-oxygen barrier layer on the surface of the flexible film layer; (4) performing array fabrication, evaporation and encapsulation process to complete the fabricating of the flexible OLED device; (5) after completion of fabricating, by using laser or baking method to make the sacrificial layer decomposition or softening, and then separating the flexible OLED device and the glass substrate by a smaller external force.

However, the above-mentioned conventional technology has many drawbacks: (a) during the preparation of the flexible film layer, the gas is easily mixed between the flexible film layer and the glass substrate, bubbles are generated during the later array process and the pre-deposition baking process, the generation of bubble will lead to damage the mask during the light irradiation defects of the array process and the evaporation process; (b) the flexible OLED device is irradiated by laser light, and a large amount of heat is generated on the surface of the flexible OLED device, which will cause thermal damage risk to the flexible OLED device. (c) the major material of the flexible film layer is polymer, having a large thermal expansion coefficient different from that of the metal electrode located on the surface thereof, and there is easy to have a peeling risk for the metal electrode and the flexible film layer; (d) during the laser irradiation, the laser may pass through the glass substrate and affect the organic light-emitting materials on the glass substrate, such as decomposition, crystallization, especially has more obvious affect to the bottom emitting device; (e) the price of the laser equipment is high so that large amount of cost for the production line is needed.

Although a carrier substrate made of a water-proof breathable material can be used to overcome the above-mentioned bubble problem currently, in this technology approach, it is necessary to prepare the flexible film layer in advance and then use an adhesive to adhere to the surface of the carrier substrate; Since there are many pores on the substrate for the release of bubbles, so the flexible film cannot be formed by directly coating on the carrier substrate, it can only take the bonding process to adhesive the flexible substrate and the carrier substrate, not only increases the complexity of the process, the flexibility of the flexible film layer has also been a huge challenge; and, due to the high temperature up to 450° C. to the flexible film during the array process, and because of the transmission property of the carrier substrate and the problem of scattering to the laser irradiation, making this carrier substrate is not suitable for laser lift-off, it can only use heating or mechanical lift-off, but also cause the problem of cleaning adhesive residue, so the technical approach has a high requirement to the carrier substrate and the adhesive.

Therefore, in the peeling process of the flexible OLED device and the carrier substrate, it urgently needs to adopt a method having less impact to the flexible OLED device to improve product yield.

SUMMARY OF THE INVENTION

In order to solve the above-mentioned problems of the conventional technology, a method for fabricating a thin-film transistor is provided in the present application, by filling filling material in the pores of the porous substrate in the fabricating method to realize the effective separation the flexible OLED and the porous substrate during the fabrication process of the thin film transistor.

In order to achieve the above application purpose, the present application adopts the following technical approach:

A fabricating method for a thin film transistor, including steps of: S1, filling filling materials into the pores of the porous substrate to obtain a carrier substrate; S2, fabricating a flexible film layer on the carrier substrate; S3, removing the filler material; S4, fabricating an organic light emitting diode on the flexible film layer; and S5, removing the porous substrate to obtain the thin film transistor.

Further, in the step S1, the end face of the filling material is preferably flush with the surface of the porous substrate.

Further, in the step S5, the porous substrate is removed by a solvent isolation method combined with an air pressing method.

Further, in the step S3, the filling material is preferably removed by a dissolving method.

Further, the filling material is a polymer, an inorganic material, a metal material, or a mixture of a polymer and an inorganic material.

Further, in the step S2, the filling material is stably present; in the step S3, the flexible film layer is stably present.

The another purpose of the present application is to provide a porous substrate, including a substrate body and a plurality of pores formed in the substrate body, wherein the material of the substrate body is selected form an inorganic material, a metallic material, or a macromolecule material.

Further, the porosity of the porous substrate is 1% to 70%.

Further, the diameter of the pores is 1 nm to 1 mm.

The another purpose of the present application is to provide a fabricating method for the porous substrate mentioned above, including steps of: Q1, homogeneously mixing and press-molding the substrate body material and the porous material to obtain a sintered body; Q2, sintering the sintered body, decomposing the porous material to obtain the porous substrate; wherein the decomposition temperature of the porous material is not exceed the sintering temperature of the substrate body material.

The Advantages of the Present Application (1) The method for fabricating the thin film transistor according to the present application is based on the porous substrate having a microporous structure, by the present of the microporous, the bubbles generated during the OLED fabricating process can be released to avoid the influence of bubbles in the light irradiation of the array process and the damage of the evaporation metal mask;

(2) The method for fabricating a thin film transistor according to the present application, comparing to the method for fabricating in the conventional technology, the step of removing the sacrificial layer by laser irradiation is eliminated, thereby avoiding damage to the material of the flexible film by the laser irradiation;

(3) The method for fabricating a thin film transistor according to the present application, the step of separation the separated glass substrate and the flexible OLED device by heating in the conventional fabricating method is eliminated, thereby preventing thermal damage to the device by heating;

(4) The method for fabricating a thin film transistor according to the present application, after separating the used porous substrate from the flexible OLED device, the surface of the obtained thin film transistor is free of extraneous impurity particles without cleaning; in the meantime, the porous substrate is not damaged so it can be reused, to reduce pollution and waste, and reduce production costs.

BRIEF DESCRIPTION OF THE DRAWINGS

In order to more clearly illustrate the embodiments of the present application or prior art, the following figures will be described in the embodiments are briefly introduced. It is obvious that the drawings are merely some embodiments of the present application, those of ordinary skill in this field can obtain other figures according to these figures without paying the premise.

DETAILED DESCRIPTION OF PREFERRED EMBODIMENTS

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts acquired should be considered within the scope of protection of the present application.

Specifically, the terminologies in the embodiments of the present application are merely for describing the purpose of the certain embodiment, but not to limit the invention. Embodiments and the claims be implemented in the present application requires the use of the singular form of the book "an", "the" and "the" are intend to include most forms unless the context clearly dictates otherwise. It should also be understood that the terminology used herein that "and/or" means and includes any or all possible combinations of one or more of the associated listed items.

It is to be noted here that in order to avoid obscuring the present invention with unnecessary detail, only the structure and/or processing steps closely related to the approach according to the invention are illustrated in the accompanying drawings, other details of the present invention not closed to the present application is omitted.

It will be understood that, although the terms "first," "second," and the like can be used herein to describe various substances, such substances should be limited by these terms. These terms are only used to distinguish one substance from the other.

Figure 1:
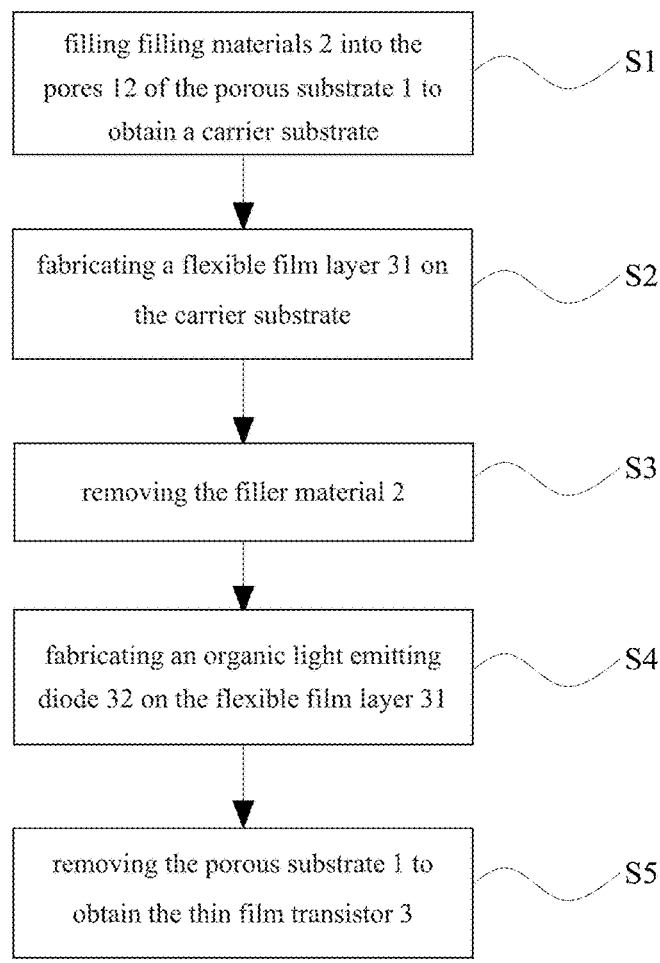
FIG. 1 is a flow chart of a method of fabricating a thin film transistor according to an embodiment of the present application.

FIG. 1 is a flow chart of a method of fabricating a thin film transistor according to an embodiment of the present application.

Figure 2:
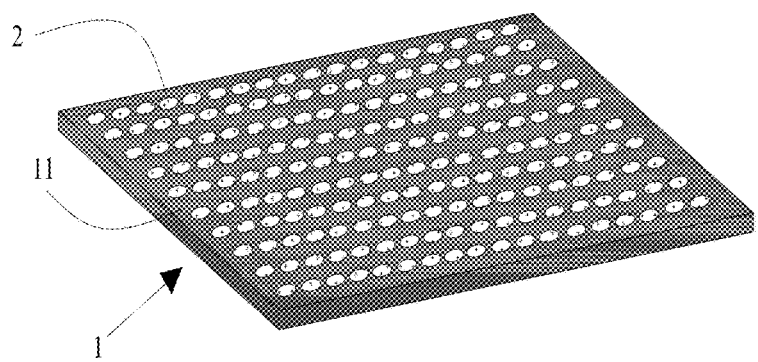
FIG. 2 is a schematic structural view of a carrier substrate according to an embodiment of the present application.

Referring to FIG. 1, the method of fabricating a thin film transistor according to the embodiment of the present application includes the steps of:

S1, filling the filling material 2 into the pores 12 of the porous substrate 1 to obtain a carrier substrate; as illustrated in FIG. 2.

Figure 3:
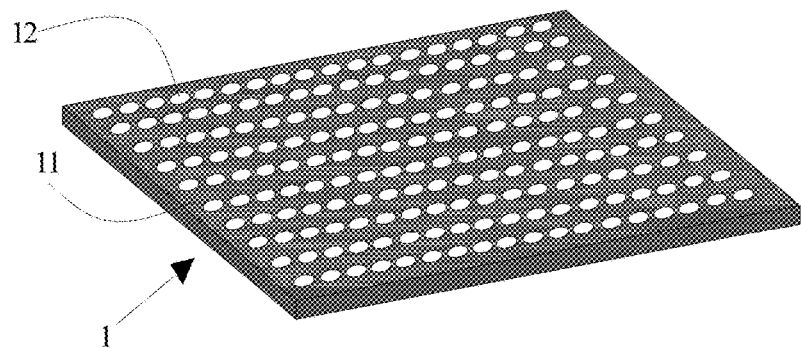
FIG. 3 is a schematic structural view of a porous substrate according to an embodiment of the present application.

Specifically, the present embodiment provides a porous substrate 1, as illustrated in FIG. 3. Which includes a substrate body 11 and a plurality of pores 12 formed on the substrate body 11. Wherein, the substrate body 11 is made of an inorganic material, a metallic material, or a macromolecule material.

More specifically, the porosity of the porous substrate 1 is 1% to 70%, and the diameter of the pores 12 is 1 nm to 1 mm.

The porous substrate 1 used in the present embodiment is obtained by adoption of the following method: (1) homogeneously mixing the substrate body material and the porous material and press-molding to obtain a sintered body; (2) sintering the sintered body, the porous material was decomposed to obtain the porous substrate 1.

In this embodiment, the material of the substrate body is preferably a boron nitride ceramic material.

It is to be noted that the decomposition temperature of the porous material should not exceed the sintering temperature of the substrate body material, so that when sintering the sintered body, the substrate body material can be sintered to obtain the substrate body 11, and the porous material dispersed homogeneously in the substrate body material is decomposed at a high temperature to form a plurality of pores 12 inside the substrate body 11.

The filling material 2 may be a polymer, an inorganic material, a metal material, or a mixture of a polymer and an inorganic material.

In this embodiment, the fabrication of the carrier substrate is for convenience of the subsequent formation of the flexible film layer and the organic light-emitting diode and to prevent the flatness issue of the flexible film layer. Therefore, the end face of the filling material 2 filled in the pores 12 is preferably flush with the surface of the substrate body 11.

Figure 4:
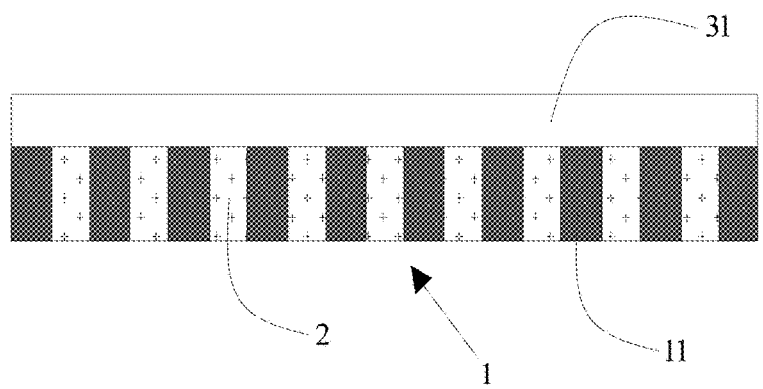
FIGS. 4 to 8 are process flow diagrams of a method of fabricating a thin film transistor according to an embodiment of the present application.

S2, fabricating the flexible film layer 31 on the carrier substrate; as illustrated in FIG. 4.

Specifically, coating a layer of precursor of the flexible film on a carrier substrate first, and then cured by heating the precursor of the flexible film layer to obtain a flexible film layer 31 on the carrier substrate.

It is noted that, during the process for preparation of the flexible film layer 31, the filling material 2 is stably present; that is, the precursor of the flexible film layer and the flexible film layer neither dissolve the filling material 2 nor chemically react with the filling material 2.

Figure 5:
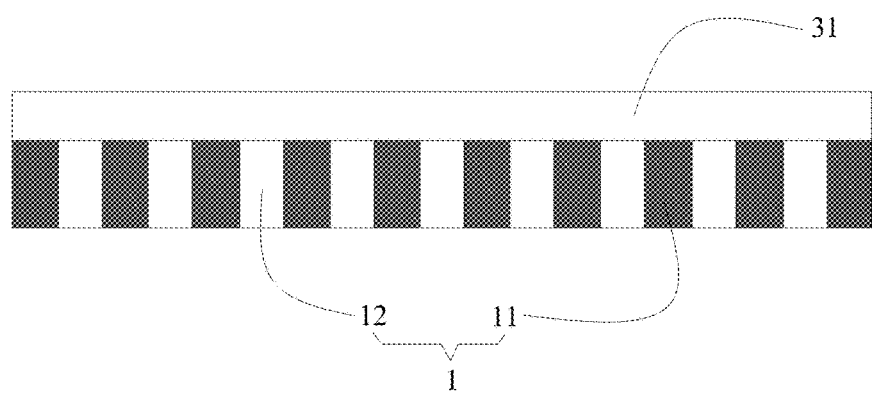

S3, removing the filler material 2; as illustrated in FIG. 5.

In this embodiment, the filling material 2 is preferably removed by a dissolving method. Specifically, the carrier substrate with the flexible film layer 31 is immersed in the first solvent, the filling material 2 is dissolved and removed by the first solvent, whereby the pores 12 in the porous substrate 1 are exposed; meanwhile, the flexible film layer 31 is only in contact and connected to the substrate body 11 and to achieve the purpose of partially in contact and connected to the porous substrate 1, the bonding between each other is not very tight and easy for the subsequent separation.

It should be noted that the first solvent is not particularly limited, as long as it is capable of dissolving the corresponding filler material 2, while keeping stably present of the flexible film layer 31.

Figure 6:
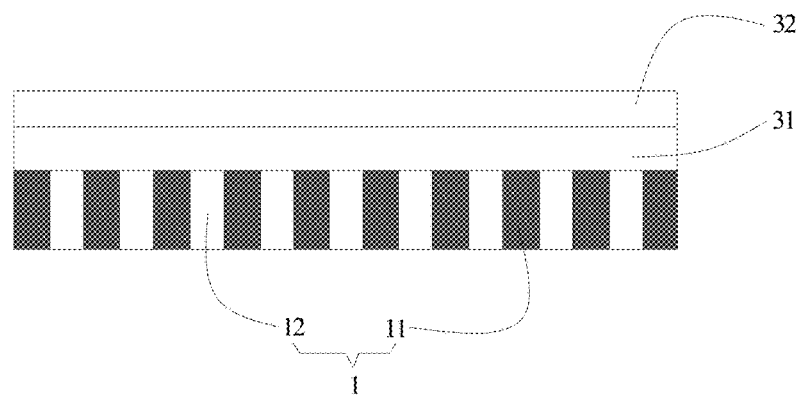

S4, fabricating an organic light emitting diode 32 on the flexible film layer 31, as illustrated in FIG. 6.

The organic light emitting diodes 32 is fabricated on the flexible film layer 31 by using the array process and the OLED process adopted in the conventional technology, the detailed steps herein is not described in detail here, and those who skilled in the art can refer to the conventional technology.

It should be noted that, in the fabricating process of the organic light emitting diode 32, the high-temperature process will make the gas mixed during the process of making the flexible film layer 31 and the insufficiently reacted impurity molecules migrating out and to form larger bubbles on the surface of the porous substrate 1; in the same time, the baking and sweating process performed before the OLED process will also exacerbate these bubbles further increased. At this time, the bubbles can be released through the pores 12 in the porous substrate 1, thereby eliminating the adverse effects during the laser irradiation and to the deposition metal mask of the OLED process.

Figure 7:
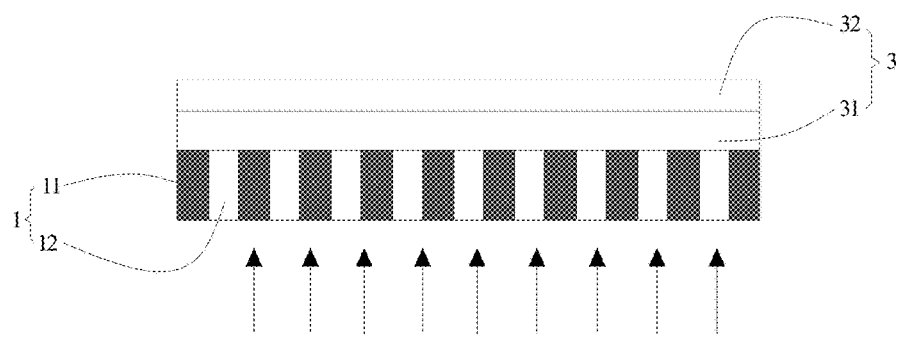
Figure 8:
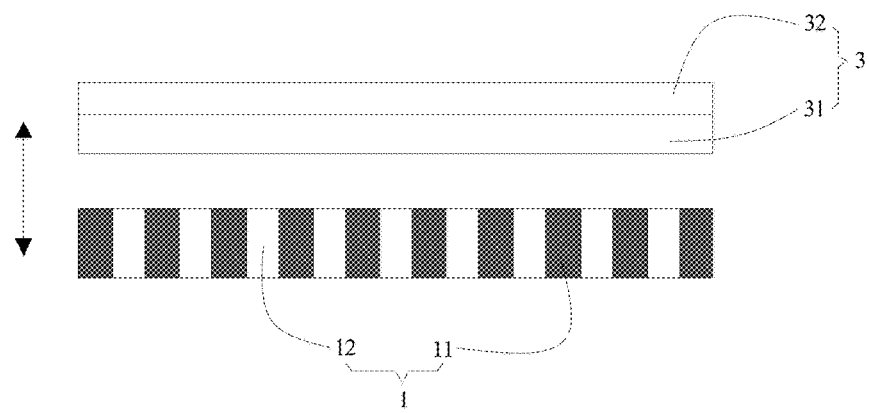

S5, removing the porous substrate 1 to obtain the thin film transistor 3; as illustrated in FIGS. 7 and 8.

Specifically, the porous substrate 1 is removed by a solvent isolation method combined with an air pressing method. Specifically, first, according to the direction of the arrow illustrated in FIG. 7, a second solvent is injected into the pores 12 of the porous substrate 1, and makes the second solvent is sufficiently diffused through the pores 12 toward the contact surface of the flexible film layer 31 and the porous substrate 1; and then according to the direction of the arrow illustrated in FIG. 7, a compressed air is blown into the pores 12, so that the flexible film layer 31 is separated from the porous substrate 1 in accordance to the direction indicated by the arrow illustrated in FIG. 8 by the external force of the air to obtain the thin film transistor 3.

It should be noted that the second solvent is also not particularly limited, the conventional reagents such as ethanol and isopropanol may be used, as long as it does not dissolve or react with the material of the porous substrate 1 and the material of the flexible film layer 31.

In the separation process, the surface of the obtained thin film transistor 3 has no foreign impurity particles and no need to be cleaned; in the meantime, the porous substrate 1 is not damaged and can be reused, to reduce the pollution and waste, and reduce the fabricating cost.

Above are embodiments of the present application, which does not limit the scope of the present application. Any modifications, equivalent replacements or improvements within the spirit and principles of the embodiment described above should be covered by the protected scope of the invention.

What is claimed is:

1. A method of making a porous substrate, comprising a substrate body and a plurality of pores formed in the substrate body, wherein the material of the substrate body is selected form an inorganic material, a metallic material, or a macromolecule material, comprising the steps of:
Q1, homogeneously mixing and press-molding the substrate body material and the porous material to obtain a sintered body;
Q2, sintering the sintered body, decomposing the porous material to obtain the porous substrate; and
wherein the decomposition temperature of the porous material is not exceeding the sintering temperature of the substrate body material.

2. The method of making a porous substrate according to claim 1, wherein the porosity of the porous substrate is 1% to 70%.

3. The method of making a porous substrate according to claim 1, wherein the diameter of the pores is 1 nm to 1 mm.

4. The method of making a porous substrate according to claim 2, wherein the diameter of the pores is 1 nm to 1 mm.

* * * * *